(12) United States Patent
Uetake (10) Patent No.: US 8,743,631 B2
(45) Date of Patent: Jun. 3, 2014

(54) SEMICONDUCTOR STORAGE DEVICE (71) Applicant: Fujitsu Limited, Kawasaki (JP)

(72) Inventor: Toshiyuki Uetake, Inagi (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 13/762,891

(22) Filed: Feb. 8, 2013

(65) Prior Publication Data

US 2013/0148446 A1    Jun. 13, 2013

Related U.S. Application Data (63) Continuation of application No. PCT/JP2010/063663, filed on Aug. 11, 2010.

(51) Int. Cl.
*G11C 7/22* (2006.01)

(52) U.S. Cl.
USPC ............ 365/189.15; 365/210.1; 365/189.011; 365/189.16

(58) Field of Classification Search
USPC .............. 365/189.15, 189.011, 210.1, 189.16
See application file for complete search history.

(56) References Cited

U.S. PATENT DOCUMENTS

| | | | | |
|---|---|---|---|---|
| 5,781,469 | A | * | 7/1998 | Pathak et al. ................. 365/156 |
| 2001/0055229 | A1 | * | 12/2001 | Koike .......................... 365/200 |
| 2003/0117826 | A1 | | 6/2003 | Karasawa |
| 2005/0073885 | A1 | | 4/2005 | Suzuki et al. |
| 2007/0002617 | A1 | * | 1/2007 | Houston et al. .......... 365/185.07 |
| 2010/0177580 | A1 | * | 7/2010 | Komatsu et al. .............. 365/203 |

FOREIGN PATENT DOCUMENTS

| | | |
|---|---|---|
| JP | 11-242897 | 9/1999 |
| JP | 2000-294748 | 10/2000 |
| JP | 2003-178594 | 6/2003 |
| JP | 2004-55094 | 2/2004 |
| JP | 2004-171633 | 6/2004 |

OTHER PUBLICATIONS

International Search Report of Corresponding PCT Application PCT/JP2010/063663 mailed Sep. 14, 2010.

* cited by examiner

*Primary Examiner* — Son Dinh
*Assistant Examiner* — Uyen B Tran
(74) *Attorney, Agent, or Firm* — Staas & Halsey LLP

(57) ABSTRACT

A semiconductor storage device includes a first cell array including a plurality of memory cells that are connected to a first word line and each of which is connected to each member of a first pair of bit lines. The semiconductor storage device also includes a second cell array including a plurality of memory cells that are connected to a second word line and each of which is connected to each member of a second pair of bit lines. The semiconductor storage device further includes a redundant cell array including a plurality of memory cells that are connected to a word line different from the first and the second word lines and each of which is connected to one member of the first pair of bit lines and to one member of the second pair of bit lines.

8 Claims, 5 Drawing Sheets

SEMICONDUCTOR STORAGE DEVICE

CROSS-REFERENCE TO RELATED APPLICATION

This application is a continuation application of International Application PCT/JP2010/063663 filed on Aug. 11, 2010 and designating the U.S., the entire contents of which are incorporated herein by reference.

FIELD

The embodiments discussed herein are directed to a semiconductor storage device.

BACKGROUND

Conventionally, to shorten the time and reduce the costs involved in designing and developing of system Large Scale Integrations (LSIs), macros are created by modularizing commonly-incorporated electronic circuits. Examples of hard Intellectual Properties (IPs) obtained by modularizing hardware such as an electronic circuit include a Central Processing Unit (CPU) macro obtained by modularizing a CPU and a Random Access Memory (RAM) macro obtained by modularizing a RAM.

In recent years, because logic functions and circuit configurations have been getting complicated due to the endeavor to lower electric power consumption and to provide more advanced functions, it is difficult to realize higher-speed processing with RAM macros. Consequently, RAM macros devised with a variety of ideas are known.

For example, a configuration is disclosed in which a redundant cell array is provided for each of cell array blocks that each represent an area of memory cell arrays in which bit lines and word lines are arranged next to one another. More specifically, in the disclosed configuration, redundant column cell arrays are arranged in the column direction of the cell array blocks, whereas redundant row cell arrays are arranged in the row direction of the cell array blocks, so that the redundant column cell arrays and the redundant row cell arrays are used in combination.

Figure 5:
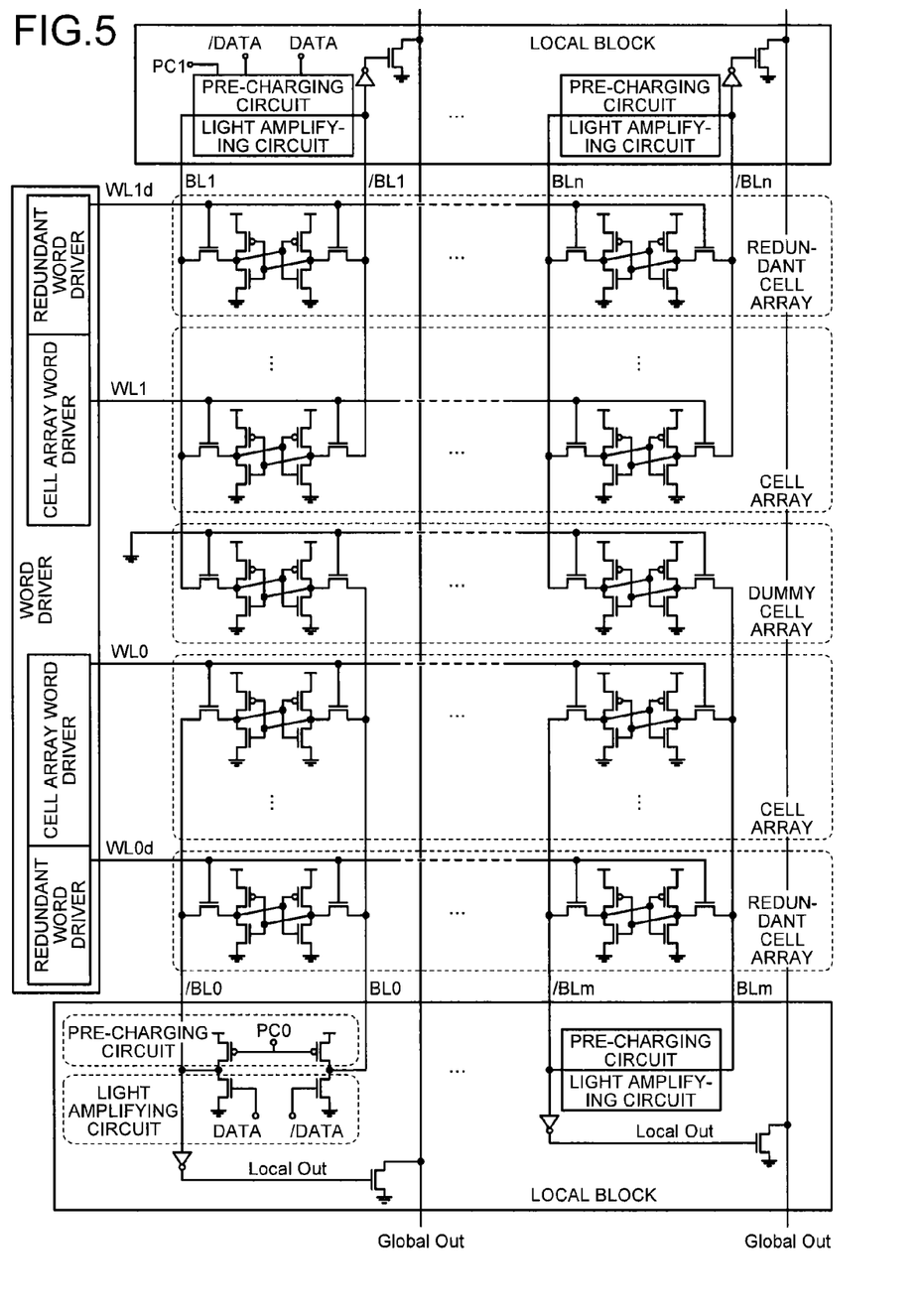
FIG. 5 is a diagram of a conventional configuration of memory cells.

As another method for achieving high-speed processing, a method has been used by which bit lines are divided, as illustrated in a memory cell configuration in FIG. 5, for example. In the memory cell configuration illustrated in FIG. 5, a redundant cell array is provided for each of cell arrays that each include a plurality of memory cells that are connected to bit lines such as BLn and /BLn (where "n" denotes the quantity of memory cells, whereas "/" denotes negativity) and connected to word lines such as WL0, WL0d, WL1, and WL1d. Further, by providing a dummy cell array between the cell arrays, the bit lines between the cell arrays are divided so as to reduce the load on the bit lines and to make the speed of the processing higher. FIG. 5 is a diagram of the conventional configuration of the memory cells.

Patent Literature 1: Japanese Laid-open Patent Publication No. 2000-294748
Patent Literature 2: Japanese Laid-open Patent Publication No. 2003-178594
Patent Literature 3: Japanese Laid-open Patent Publication No. 2004-055094

According to the conventional technique, however, the number of sections into which the cell arrays are divided increases, as the speed of the RAM macro is made higher and as the capacity of the RAM macro is made larger. As a result, problems arise where a large proportion is accounted for by the redundant cell arrays provided for the cell arrays and by the dummy cell array used for dividing the bit lines and where the macro area size becomes larger. In other words, according to the conventional technique, although a high-speed operation and redundancy efficiency of the RAM macro are maintained, it is difficult to keep the RAM macro compact because the area sizes of the redundant cell arrays and the dummy cell array are large.

Figure 6:
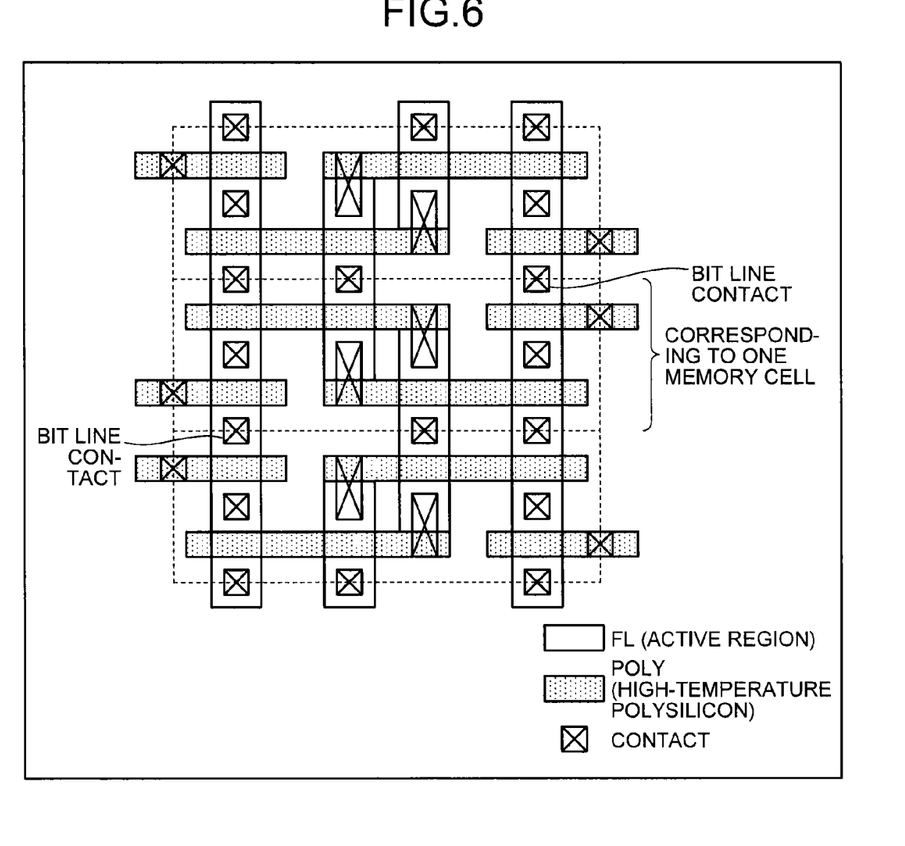
FIG. 6 is a diagram for a memory cell layout of a six-transistor SRAM.

Further, as illustrated in FIG. 6, bit line contacts used for connecting bit lines and memory cells together are arranged in cell-end positions of the memory cells. Because each of the bit line contacts is shared by adjacently-positioned memory cells, it is not possible to divide the bit lines at the cell-end positions of the memory cells. Accordingly, in order to maintain the continuity of the memory cells, the dummy cell array that divides the bit lines is used to have an area size equal to at least one memory cell. As a result, the RAM macro area size increases. FIG. 6 is a diagram for a memory cell layout of a six-transistor Static Random Access Memory (SRAM).

SUMMARY

According to an aspect of the embodiment of the invention, a semiconductor storage device includes: a first cell array including a plurality of memory cells that are connected to a first word line and each of which is connected to each member of a first pair of bit lines; a second cell array including a plurality of memory cells, that are connected to a second word line and each of which is connected to each member of a second pair of bit lines; and a redundant cell array including a plurality of memory cells, that are connected to a third word line different from the first and the second word lines and each of which is connected to one member of the first pair of bit lines and to one member of the second pair of bit lines.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

In the following sections, exemplary embodiments of a semiconductor storage device disclosed in the present application will be explained in detail, with reference to the accompanying drawings. The present application is not limited by these exemplary embodiments.

First Embodiment

<A Configuration of a Semiconductor Storage Device>

Figure 1:
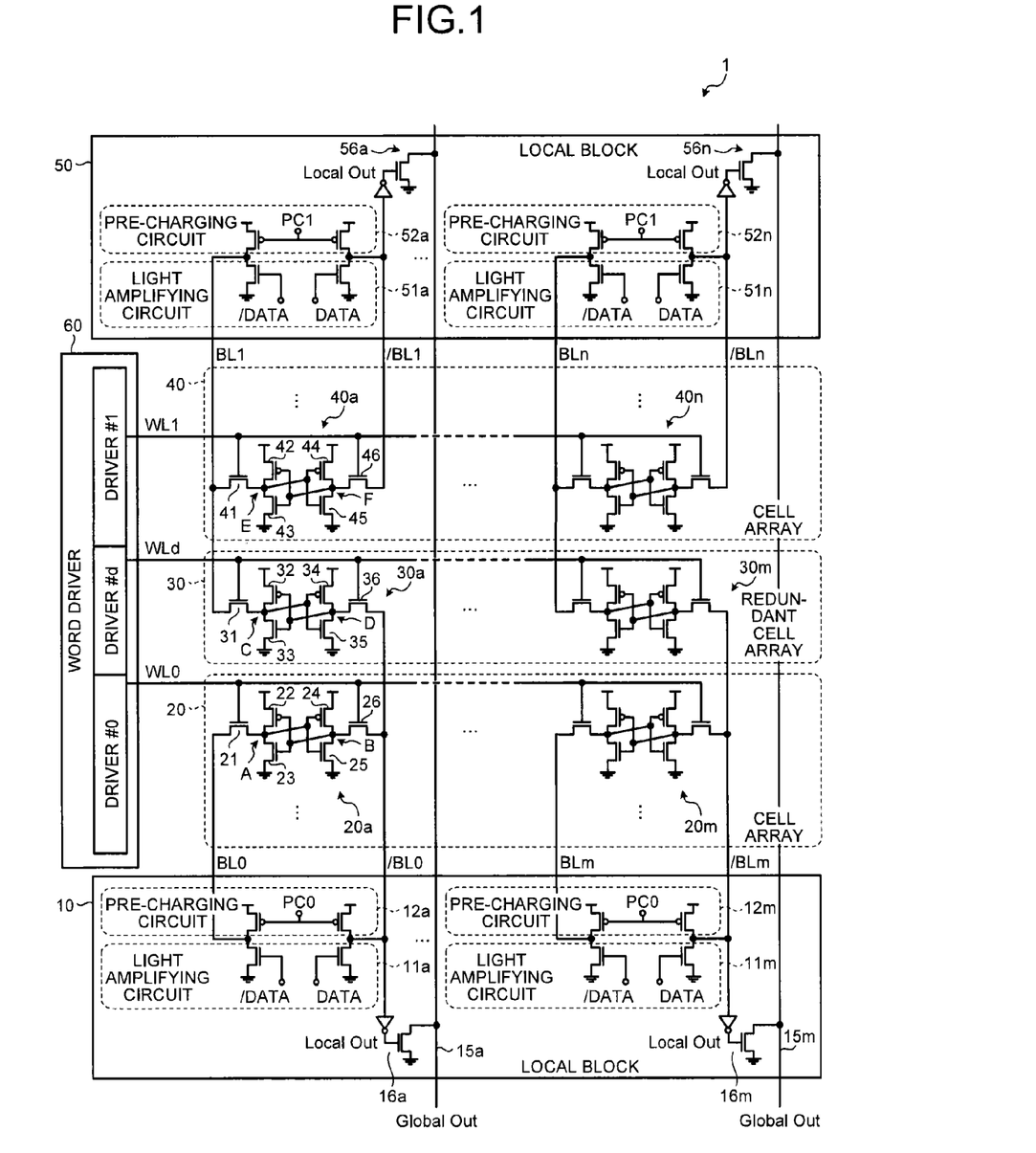
FIG. 1 is a circuit diagram of memory cells structuring a semiconductor storage device according to a first embodiment.

FIG. 1 is a circuit diagram of memory cells structuring a semiconductor storage device according to a first embodiment. In the following sections, an example of a Static Random Access Memory (SRAM) will be explained in which memory cells each having six transistors are arranged in a matrix formation; however, the memory cells are not limited to those included in a six-transistor SRAM. As depicted in FIG. 1, a semiconductor storage device 1 includes a local block 10, a cell array 20, a redundant cell array 30, a cell array 40, a local block 50, and a word driver 60. It is acceptable to configure the semiconductor storage device 1 so as to have a circuit configuration other than the one illustrated in FIG. 1.

<A Configuration of the Local Block 10>

The local block 10 includes read inverters 16a to 16m respectively connected to inversion bit lines /BL0 to /BLm each of which can be connected to either a corresponding one of the memory cells included in the cell array 20 or a corresponding one of the memory cells included in the redundant cell array 30. Further, the local block 10 includes light amplifying circuits 11a to 11m and pre-charging circuits 12a to 12m in correspondence with the memory cells included in the cell array 20. The light amplifying circuits 11a to 11m have mutually the same configuration, whereas the pre-charging circuits 12a to 12m have mutually the same configuration. Thus, only the light amplifying circuit 11a and the pre-charging circuit 12a will be explained in detail below.

Each of the read inverters 16a to 16m amplifies a signal read through either a corresponding one of bit lines BL0 to BLm or a corresponding one of the inversion bit lines /BL0 to /BLm and outputs the amplified signal to a corresponding one of global bit lines 15a to 15m. As a result, each of the read inverters 16a to 16m is able to read the data stored in a corresponding one of the memory cells and to output the read data to the source of a read request.

Each of the light amplifying circuits 11a to 11m receives write data from an external source or the like and outputs the received data to either a corresponding one of the bit lines BL0 to BLm or a corresponding one of the inversion bit lines /BL0 to /BLm. More specifically, each of the light amplifying circuits 11a to 11m establishes connections to a data line DATA and an inversion data line /DATA used for receiving the write data from the external source in such a manner that a pair of mutually-complementary pieces of data made up of data and inverted data is input/output to a pair of mutually-complementary bit lines made up of a bit line and an inversion bit line provided for the redundant cell array 30. Further, each of the light amplifying circuits 11a to 11m stores the data into either a predetermined one of the memory cells in the cell array 20 or a predetermined one of the memory cells in the redundant cell array 30, via the bit line described above.

For example, the light amplifying circuit 11a includes an N-type transistor (i.e., a Negative Channel Metal Oxide Semiconductor [NMOS] Transistor) that receives write target data (i.e., data to be written) and outputs the received write target data to the inversion bit line /BL0. Further, the light amplifying circuit 11a includes an N-type transistor that outputs data obtained by inverting the write target data to BL0. In an example, the light amplifying circuit 11a outputs "1" to the inversion bit line /BL0 via the N-type transistor and, at the same time, outputs "0" to the bit line BL0 via the N-type transistor.

The pre-charging circuit 12a includes two P-type transistors (i.e., Positive Channel Metal Oxide Semiconductor [PMOS] Transistors). The pre-charging circuit 12a cancels a pre-charging operation when data is to be written to or read from any of memory cells 20a to 20m included in the cell array 20 and memory cells 30a to 30m included in the redundant cell array 30, by using the two P-type transistors. For example, when data is to be written to any of the memory cells 20a to 20m or to any of the memory cells 30a to 30m included in the redundant cell array 30, the pre-charging circuit 12a cancels the pre-charging operation by turning on a pre-charging signal line PC0 and reducing the potentials of the bit line BL0 and the inversion bit line /BL0.

<A Configuration of the Cell Array 20>

The cell array 20 includes the memory cells 20a to 20m connected to a word line WL0. Further, each of the memory cells 20a to 20m included in the cell array 20 can be connected to the local block 10 via either a corresponding one of the bit lines BL0 to BLm or a corresponding one of the inversion bit lines /BL0 to /BLm. The inversion bit lines /BL0 to /BLm connected to the memory cells 20a to 20m included in the cell array 20 are used as local bit lines connected to the read inverters 16a to 16m, respectively. Data is written to and read from the memory cells 20a to 20m included in the cell array 20 by the local block 10.

The memory cells 20a to 20m have mutually the same configuration. Thus, only the memory cell 20a will be explained below. In FIG. 1, the plurality of memory cells are arranged along the bit direction; however, the exemplary embodiments are not limited to this example. It is acceptable to also arrange a plurality of memory cells along the word direction. In that situation, the memory cells arranged along the word direction are connected to the word driver 60 by word lines.

The memory cell 20a is a six-transistor cell including two Complementary Metal Oxide Semiconductor (CMOS) inverters each including a PMOS transistor and an NMOS transistor, as well as two MOS transistors used for inputting and outputting data. More specifically, the memory cell 20a includes an N-type transistor 21, a P-type transistor 22, an N-type transistor 23, a P-type transistor 24, an N-type transistor 25, and an N-type transistor 26. Further, in the memory cell 20a, the inverters are connected so as to form a loop with the P-type transistor 22, the N-type transistor 23, the P-type transistor 24, and the N-type transistor 25, so that a latch for storing data is formed.

The N-type transistor 21 is connected to the word line WL0 and to the bit line BL0 and is connected to the pre-charging circuit 12a and the light amplifying circuit 11a included in the local block 10 via the bit line BL0. The N-type transistor 21 is connected to the P-type transistor 22 and to the N-type transistor 23.

The P-type transistor 22 is connected to the N-type transistor 21 and to the N-type transistor 23 and is also connected to a negative supply voltage of the MOS elements. The N-type transistor 23 is connected to the N-type transistor 21 and to the P-type transistor 22 and is also connected to a ground, which is a power supply voltage of the MOS elements. The P-type transistor 24 is connected to the N-type transistor 25 and to the N-type transistor 26 and is also connected to a negative supply voltage of the MOS elements. The N-type transistor 25 is connected to the N-type transistor 26 and to the P-type transistor 24 and is also connected to a ground, which is a power supply voltage of the MOS elements.

The N-type transistor 26 is connected to the word line WL0 and to the inversion bit line /BL0 and is connected to the pre-charging circuit 12a and the light amplifying circuit 11a included in the local block 10 via the inversion bit line /BL0. Also, the N-type transistor 26 is connected to the P-type transistor 24 and to the N-type transistor 25.

Next, writing and reading data to and from the memory cell 20a will be explained. For example, when data is to be written to the memory cell 20a, the word line WL0 is set to high ("H") by the word driver 60, so that the N-type transistor 21 and the N-type transistor 26 are turned on. At that time, the bit line BL0 is set to H, and the inversion bit line /BL0 is set to low ("L") by the local block 10. Further, the P-type transistor 22 and the N-type transistor 23 are connected to the inversion bit line /BL0 via the N-type transistor 26 so that the P-type transistor 22 is turned off, whereas the N-type transistor 23 is turned on. Also, the P-type transistor 24 and the N-type transistor 25 are connected to the bit line BL0 via the N-type transistor 21 so that the P-type transistor 24 is turned off, whereas the N-type transistor 25 is turned on.

As a result, "1" is written to a left node A including the transistors 21, 22, and 23, whereas "0" is written to a right node B including the transistors 24, 25, and 26. In contrast, when the bit line BL0 is set to L while the inversion bit line /BL0 is set to H, "0" is written to the left node A, whereas "1" is written to the right node B. After that, when the word line WL0 is set to L by the word driver 60, because the N-type transistor 21 and the N-type transistor 26 are turned off, the data in the left and the right nodes is held while the power is supplied to the transistors 22, 23, 24, and 25. Further, to read the data, when the bit line BL0 and the inversion bit line /BL0 are arranged to have mutually the same potential by the local block 10, and also, the word line WL0 is set to H by the word driver 60, the data held in the left node A is read through the bit line BL0, whereas the data held in the right node B is read through the inversion bit line /BL0.

<A Configuration of the Redundant Cell Array 30>

The redundant cell array 30 includes the redundant memory cells 30a to 30m connected to a word line WLd. Further, each of the redundant memory cells 30a to 30m is connected to the local block 50 via a corresponding one of the bit lines BL1 to BLn and is connected to the local block 10 via a corresponding one of the inversion bit lines /BL0 to /BLm. The inversion bit lines /BL0 to /BLm connected to the redundant memory cells 30a to 30m included in the redundant cell array 30 are used as local bit lines connected to the read inverters 16a to 16m, respectively. Data is written to and read from the redundant memory cells 30a to 30m by the local block 10 or the local block 50.

The redundant memory cells 30a to 30m function as redundant circuits that guarantee writing or reading of data in case of a failure of the cell array 20 or the cell array 40. Further, the redundant memory cells 30a to 30m function as dummy cells that divide the bit lines BL0, BL1, . . . , BLm, and BLn and divide the inversion bit lines /BL0, /BL1, . . . , /BLm, and /BLn between the cell array 20 and the cell array 40. The redundant memory cells 30a to 30m have mutually the same configuration. Thus, only the redundant memory cell 30a will be explained below.

Like the memory cell 20a, the redundant memory cell 30a is a six-transistor cell including two CMOS inverters and two MOS transistors used for transferring data. More specifically, the redundant memory cell 30a includes an N-type transistor 31, a P-type transistor 32, an N-type transistor 33, a P-type transistor 34, an N-type transistor 35, and an N-type transistor 36. Further, in the redundant memory cell 30a, the inverters are connected so as to form a loop with the P-type transistor 32, the N-type transistor 33, the P-type transistor 34, and the N-type transistor 35, so that a latch for storing data is formed.

The N-type transistor 31 is connected to the word line WLd and to the bit line BL1 and is connected to a pre-charging circuit 52a and a light amplifying circuit 51a included in the local block 50 via the bit line BL1. The N-type transistor 31 is connected to the P-type transistor 32 and to the N-type transistor 33.

The P-type transistor 32 is connected to the N-type transistor 31 and to the N-type transistor 33 and is also connected to a negative supply voltage of the MOS elements. The N-type transistor 33 is connected to the N-type transistor 31 and to the P-type transistor 32 and is also connected to a ground, which is a power supply voltage of the MOS elements. The P-type transistor 34 is connected to the N-type transistor 35 and to the N-type transistor 36 and is also connected to a negative supply voltage of the MOS elements. The N-type transistor 35 is connected to the N-type transistor 36 and to the P-type transistor 34 and is also connected to a ground, which is a power supply voltage of the MOS elements.

The N-type transistor 36 is connected to the word line WLd and to the inversion bit line /BL0 and is connected to the pre-charging circuit 12a and the light amplifying circuit 11a included in the local block 10 via the inversion bit line /BL0. Also, the N-type transistor 36 is connected to the P-type transistor 34 and to the N-type transistor 35.

Next, writing and reading data to and from the redundant memory cell 30a will be explained. For example, when data is to be written to the redundant memory cell 30a, the word line WLd is set to H by the word driver 60, so that the N-type transistor 31 and the N-type transistor 36 are turned on. At that time, the bit line BL1 is set to H by the local block 10, whereas the inversion bit line /BL0 is set to L by the local block 50. Further, the P-type transistor 32 and the N-type transistor 33 are connected to the inversion bit line /BL0 via the N-type transistor 36 so that the P-type transistor 32 is turned off, whereas the N-type transistor 33 is turned on. Also, the P-type transistor 34 and the N-type transistor 35 are connected to the bit line BL1 via the N-type transistor 31 so that the P-type transistor 34 is turned off, whereas the N-type transistor 35 is turned on.

As a result, "1" is written to a left node C including the transistors 31, 32, and 33, whereas "0" is written to a right node D including the transistors 34, 35, and 36. In contrast, when the bit line BL1 is set to L while the inversion bit line /BL0 is set to H, "0" is written to the left node C, whereas "1" is written to the right node D. After that, when WLd is set to L by the word driver 60, because the N-type transistor 31 and the N-type transistor 36 are turned off so that no electric conduction is allowed, the data in the left and the right nodes is held while the power is supplied to the transistors 32, 33, 34, and 35. Further, to read the data, when the bit line BL1 and the inversion bit line /BL0 are arranged to have mutually the same potential by the local block 10 and the local block 50, and also, the word line WLd is set to H by the word driver 60, the data held in the left node C is read through the bit line BL1, whereas the data held in the right node D is read through the inversion bit line /BL0.

<A Configuration of the Cell Array 40>

The cell array 40 includes memory cells 40a to 40n connected to a word line WL1. Further, each of the memory cells 40a to 40n can be connected to the local block 50 via either a corresponding one of the bit lines BL1 to BLn or a corresponding one of the inversion bit lines /BL1 to /BLn. The inversion bit lines /BL1 to /BLn connected to the memory cells 40a to 40n included in the cell array 40 are used as local bit lines connected to read inverters 56a to 56n, respectively. Data is written to and read from the memory cells 40a to 40n included in the cell array 40 by the local block 50.

The memory cells 40a to 40n have mutually the same configuration. Thus, only the memory cell 40a will be explained below. In FIG. 1, the plurality of memory cells are arranged along the bit direction; however, the exemplary embodiments are not limited to this example. It is acceptable to also arrange a plurality of memory cells along the word direction. In that situation, the memory cells arranged along the word direction are connected to the word driver 60 by word lines.

Like the memory cell 20a, the memory cell 40a is a six-transistor cell including two CMOS inverters and two MOS transistors used for transferring data. More specifically, the memory cell 40a includes an N-type transistor 41, a P-type transistor 42, an N-type transistor 43, a P-type transistor 44, an N-type transistor 45, and an N-type transistor 46. Further, in the memory cell 40a, the inverters are connected so as to form a loop with the P-type transistor 42, the N-type transistor 43, the P-type transistor 44, and the N-type transistor 45, so that a latch for storing data is formed.

The N-type transistor 41 is connected to the word line WL1 and to the bit line BL1 and is connected to the pre-charging circuit 52a and the light amplifying circuit 51a included in the local block 50 via the bit line BL1. The N-type transistor 41 is connected to the P-type transistor 42 and to the N-type transistor 43.

The P-type transistor 42 is connected to the N-type transistor 41 and to the N-type transistor 43 and is also connected to a negative supply voltage of the MOS elements. The N-type transistor 43 is connected to the N-type transistor 41 and to the P-type transistor 42 and is also connected to a ground, which is a power supply voltage of the MOS elements. The P-type transistor 44 is connected to the N-type transistor 45 and to the N-type transistor 46 and is also connected to a negative supply voltage of the MOS elements. The N-type transistor 45 is connected to the N-type transistor 46 and to the P-type transistor 44 and is also connected to a ground, which is a power supply voltage of the MOS elements.

The N-type transistor 46 is connected to the word line WL1 and to the inversion bit line /BL1 and is connected to the pre-charging circuit 52a and the light amplifying circuit 51a included in the local block 50 via the inversion bit line /BL1. Also, the N-type transistor 46 is connected to the P-type transistor 44 and to the N-type transistor 45.

Next, writing and reading data to and from the memory cell 40a will be explained. For example, when data is to be written to the memory cell 40a, the word line WL1 is set to H by the word driver 60, so that the N-type transistor 41 and the N-type transistor 46 are turned on. At that time, the bit line BL1 is set to H whereas the inversion bit line /BL1 is set to L by the local block 50. Further, the P-type transistor 42 and the N-type transistor 43 are connected to the inversion bit line /BL1 via the N-type transistor 46 so that the P-type transistor 42 is turned off, whereas the N-type transistor 43 is turned on. Also, the P-type transistor 44 and the N-type transistor 45 are connected to the bit line BL1 via the N-type transistor 41 so that the P-type transistor 44 is turned off, whereas the N-type transistor 45 is turned on.

As a result, "1" is written to a left node E including the transistors 41, 42, and 43, whereas "0" is written to a right node F including the transistors 44, 45, and 46. In contrast, when the bit line BL1 is set to L while the inversion bit line /BL1 is set to H, "0" is written to the left node E, whereas "1" is written to the right node F. After that, when the word line WL1 is set to L by the word driver 60, because the N-type transistor 41 and the N-type transistor 46 are turned off so that no electric conduction is allowed, the data in the left and the right nodes is held while the power is supplied to the transistors 42, 43, 44, and 45. Further, to read the data, when the bit line BL1 and the inversion bit line /BL1 are arranged to have mutually the same potential by the local block 50, and also, the word line WL1 is set to H by the word driver 60, the data held in the left node E is read through the bit line BL1, whereas the data held in the right node F is read through the inversion bit line /BL1.

<A Configuration of the Local Block 50>

The local block 50 includes the read inverters 56a to 56n respectively connected to the inversion bit lines /BL1 to /BLn each of which can be connected to either a corresponding one of the memory cells included in the cell array 40 or a corresponding one of the memory cells included in the redundant cell array 30. Further, the local block 50 includes light amplifying circuits 51a to 51n and pre-charging circuits 52a to 52n in correspondence with the memory cells included in the cell array 40. The light amplifying circuits 51a to 51n have mutually the same configuration, whereas the pre-charging circuits 52a to 52n have mutually the same configuration. Thus, only the light amplifying circuit 51a and the pre-charging circuit 52a will be explained in detail below.

Each of the read inverters 56a to 56n amplifies a signal read through either a corresponding one of the bit lines BL1 to BLn or a corresponding one of the inversion bit lines /BL1 to /BLn and outputs the amplified signal to a corresponding one of the global bit lines 15a to 15m. As a result, each of the read inverters 56a to 56n is able to read the data stored in a corresponding one of the memory cells and to output the read data to the source of a read request.

Each of the light amplifying circuits 51a to 51n receives write data from an external source or the like and outputs the received data to either a corresponding one of the bit lines BL1 to BLn or a corresponding one of the inversion bit lines /BL1 to /BLn. More specifically, each of the light amplifying circuits 51a to 51n establishes connections to the data line DATA and the inversion data line /DATA used for receiving the write data from the external source in such a manner that a pair of mutually-complementary pieces of data made up of data and inverted data is input/output to a pair of mutually-complementary bit lines made up of a bit line and an inversion bit line provided for the redundant cell array 30. Further, each of the light amplifying circuits 51a to 51n stores the data into either a predetermined one of the memory cells in the cell array 40 or a predetermined one of the memory cells in the redundant cell array 30, via the bit line described above.

For example, the light amplifying circuit 51a includes an N-type transistor that receives write target data and outputs the received write target data to the inversion bit line /BL1. Further, the light amplifying circuit 51a includes an N-type transistor that outputs data obtained by inverting the write target data to the bit line BL1. In an example, when having output "1" to the inversion bit line /BL1 via the N-type transistor, the light amplifying circuit 51a outputs "0" to the bit line BL1 via the N-type transistor.

The pre-charging circuit 52a includes two P-type transistors. The pre-charging circuit 52a cancels the pre-charging operation when data is to be written to or read from any of the memory cells 40a to 40n included in the cell array 40 or any of the memory cells 30a to 30m included in the redundant cell array 30, by using the two P-type transistors. For example, the pre-charging circuit 52a cancels the pre-charging operation by turning on a pre-charging signal line PC1 and reducing the potentials of the bit line BL1 and the inversion bit line /BL1.

<A Configuration of the Word Driver 60>

The word driver 60 is a driver that controls the word lines WL0, WLd, and WL1 that are control signal lines used for selecting one of the cell arrays. The word driver 60 includes a driver #0, a driver #d, and a driver #1. FIG. 1 illustrates an example in which the word driver 60 is connected to each of the cell arrays 20 and 40 by a single word line; however, the exemplary embodiments are not limited to this example. For instance, it is also acceptable to provide one or more word lines along the word direction, in addition to the word lines WL0, WLd, and WL1. It is also acceptable to provide as many word lines as the number of memory cells that are included in the cell array 20 or the cell array 40 and are arranged along the word direction.

When data needs to be written or read, the word driver 60 outputs a control instruction to one of the drivers connected to the word line connected to the memory cell to or from which the data is to be written or read. Further, the driver that has received the control instruction controls the corresponding word line.

For example, the driver #0 is a driver that controls the word line WL0. When data is to be written to or read from any of the memory cells 20a to 20m included in the cell array 20, the driver #0 sets the word line WL0 to H. In other words, the driver #0 raises the voltage of the word line WL0. Further, when the data finishes being written to or being read from any of the memory cells 20a to 20m included in the cell array 20, the driver #0 sets the word line WL0 to L. In other words, the driver #0 lowers the voltage of the word line WL0.

Similarly, the driver #d is a driver that controls the word line WLd. When data is to be written to or read from any of the redundant memory cells 30a to 30m included in the redundant cell array 30, the driver #d sets the word line WLd to H. Further, when the data finishes being written to or being read from any of the redundant memory cells 30a to 30m included in the redundant cell array 30, the driver #d sets the word line WLd to L.

Similarly, the driver #1 is a driver that controls the word line WL1. When data is to be written to or read from any of the memory cells 40a to 40n included in the cell array 40, the driver #1 sets the word line WL1 to H. Further, when the data finishes being written to or being read from any of the memory cells 40a to 40n included in the cell array 40, the driver #1 sets the word line WL1 to L.

<A Time Chart Used when the Redundant Cell Array 30 is Selected>

Figure 2:
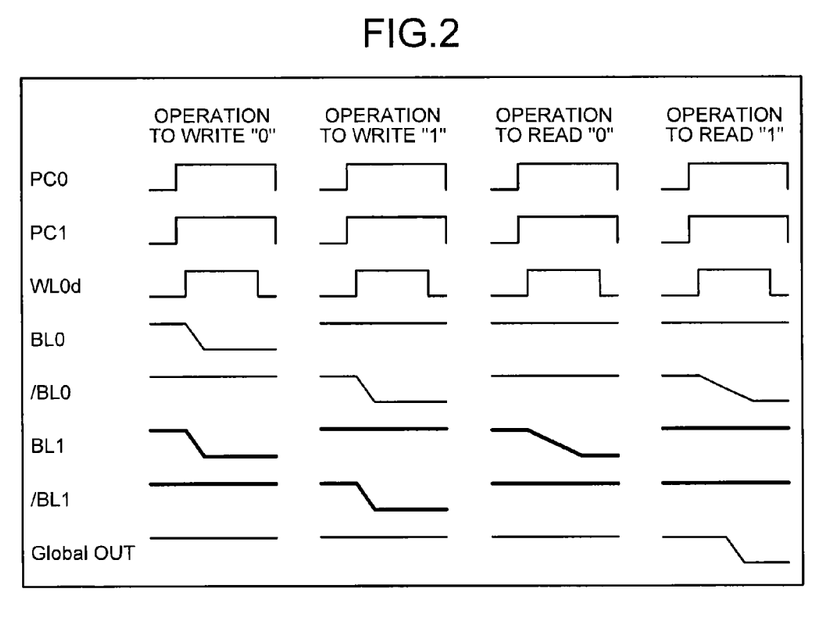
FIG. 2 is a time chart used when a redundant cell array is selected.

Next, a time chart used when the redundant cell array included in the semiconductor storage device illustrated in FIG. 1 is selected will be explained, with reference to FIG. 2. FIG. 2 is a time chart used when the redundant cell array is selected. To facilitate the explanation, an example will be explained below in which data is written to and read from the memory cell 30a included in the redundant cell array 30.

<An Operation to Write "0">

First, when "0" is to be written to the memory cell 30a included in the redundant cell array 30, the semiconductor storage device 1 cancels the pre-charging operation by turning on PC0 by employing the pre-charging circuit 12a included in the local block 10. Further, the semiconductor storage device 1 cancels the pre-charging operation by turning on PC1 by employing the pre-charging circuit 52a included in the local block 50. After that, the semiconductor storage device 1 sets the word line WLd to H by employing the driver #d included in the word driver 60. Subsequently, the semiconductor storage device 1 sets the bit lines BL0 and BL1 to L, so as to write "0" to the memory cell 30a included in the redundant cell array 30.

<An Operation to Write "1">

When "1" is to be written to the memory cell 30a included in the redundant cell array 30, the semiconductor storage device 1 cancels the pre-charging operation by turning on the pre-charging signal line PC0 by employing the pre-charging circuit 12a included in the local block 10. Further, the semiconductor storage device 1 cancels the pre-charging operation by turning on the pre-charging signal line PC1 by employing the pre-charging circuit 52a included in the local block 50. After that, the semiconductor storage device 1 sets the word line WLd to H by employing the driver #d included in the word driver 60. Subsequently, the semiconductor storage device 1 sets the inversion bit lines /BL0 and /BL1 to L, so as to write "1" to the memory cell 30a included in the redundant cell array 30.

<An Operation to Read "0">

When "0" is to be read from the memory cell 30a included in the redundant cell array 30, the semiconductor storage device 1 cancels the pre-charging operation by turning on the pre-charging signal line PC0 by employing the pre-charging circuit 12a included in the local block 10. Further, the semiconductor storage device 1 cancels the pre-charging operation by turning on the pre-charging signal line PC1 by employing the pre-charging circuit 52a included in the local block 50. After that, the semiconductor storage device 1 sets the word line WLd to H by employing the driver #d included in the word driver 60. Subsequently, the semiconductor storage device 1 sets the bit line BL1 to L, so as to read "0" from the memory cell 30a included in the redundant cell array 30.

<An Operation to Read "1">

When "1" is to be read from the memory cell 30a included in the redundant cell array 30, the semiconductor storage device 1 cancels the pre-charging operation by turning on the pre-charging signal line PC0 by employing the pre-charging circuit 12a included in the local block 10. Further, the semiconductor storage device 1 cancels the pre-charging operation by turning on the pre-charging signal line PC1 by employing the pre-charging circuit 52a included in the local block 50. After that, the semiconductor storage device 1 sets the word line WLd to H by employing the driver #d included in the word driver 60. Subsequently, the semiconductor storage device 1 sets the inversion bit line /BL0 to L, so as to read "1" from the memory cell 30a included in the redundant cell array 30 through the global bit line 15a.

<Operations of a Commonly-Used Semiconductor Storage Device>

Figure 3:
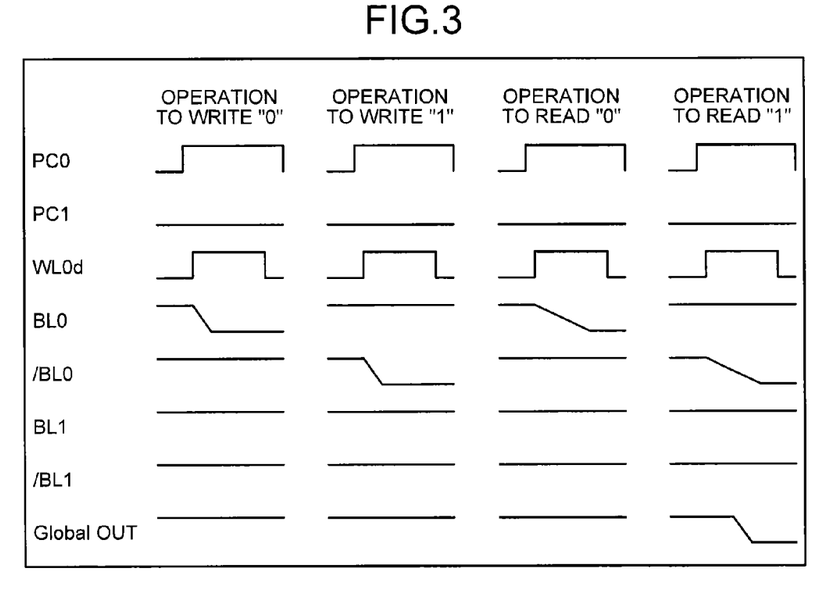
FIG. 3 is a time chart of operations performed on a redundant cell array by a commonly-used semiconductor storage device.

In contrast, when "0" is to be written to a memory cell in a redundant cell array, a commonly-used semiconductor storage device as illustrated in FIG. 5, for example, cancels the pre-charging operation by turning on only the pre-charging signal line PC0, as illustrated in FIG. 3. Subsequently, the semiconductor storage device sets the word line WL0d for the redundant cell array to H and sets only the bit line BL0 to L so as to write "0" to the memory cell. FIG. 3 is a time chart of operations performed on the redundant cell array by the commonly-used semiconductor storage device.

Similarly, when "1" is to be written to a memory cell in the redundant cell array, the semiconductor storage device cancels the pre-charging operation by turning on only the pre-charging signal line PC0, as illustrated in FIG. 3. Subsequently, the semiconductor storage device sets the word line WL0d for the redundant cell array to H and sets only the bit line BL1 to L, so as to write "1" to the memory cell.

When "0" is to be read from a memory cell in the redundant cell array, the semiconductor storage device cancels the pre-charging operation by turning on only the pre-charging signal line PC0, as illustrated in FIG. 3. Subsequently, the semiconductor storage device sets the word line WL0d for the redundant cell array to H and sets only the bit line BL0 to L, so as to read "0" from the memory cell.

Similarly, when "1" is to be read from a memory cell in the redundant cell array, the semiconductor storage device cancels the pre-charging operation by turning on only the pre-charging signal line PC0, as illustrated in FIG. 3. Subsequently, the semiconductor storage device sets the word line WL0d for the redundant cell array to H and sets only the inversion bit line /BL0 to L, so as to read "1" through the global bit line.

Advantageous Effects of the First Embodiment

According to the first embodiment, because the bit-line-dividing dummy cell array is used as the redundant cell array, each of the bit lines connected to the redundant memory cells is connected to both of the upper and the lower cell arrays. Consequently, when data is to be read, the pre-charging operations of both the upper and the lower cell arrays are cancelled by employing the pre-charging signal lines PC0 and PC1 so as to read the data. In contrast, when data is to be written, the bit lines BL0 and BL1 and the inversion bit lines /BL0 and /BL1 or the like for both the upper and the lower cell arrays are operated so as to write the data to a redundant memory cell. As a result, it is possiblee to utilize the bit-line-dividing dummy cell array as the redundant cell array and it is therefore possible to maintain the high-speed operation and the redundancy efficiency. Consequently, it is possible to reduce the macro area size while maintaining the high-speed operation and the redundancy efficiency. It is further possible to lower the electric power consumption due to the reduction of the macro area size.

Second Embodiment

Figure 4:
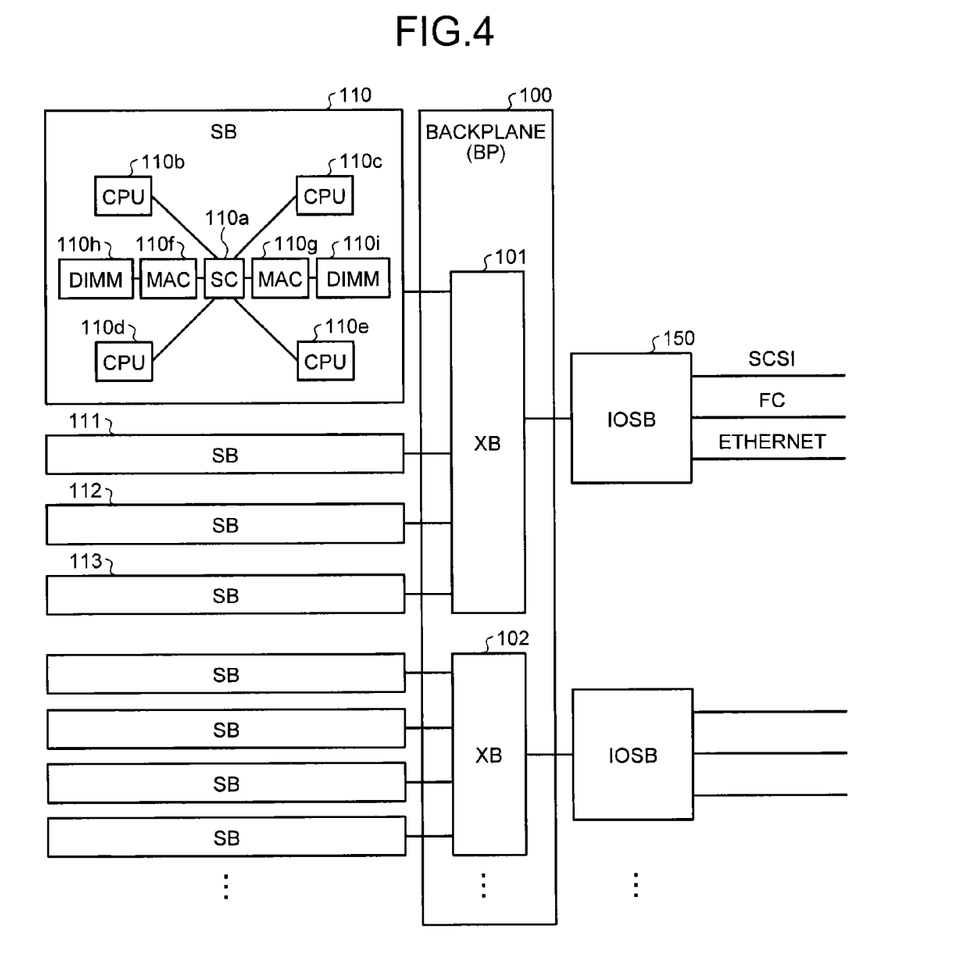
FIG. 4 is a diagram of an example of an information processing apparatus using the semiconductor storage device disclosed in the present application.

Some of the exemplary embodiments of the semiconductor storage device disclosed in the present application have thus been explained. However, the present application may be embodied in various different modes other than the embodiments described above. Thus, some other exemplary embodiments will be described below.
<A Configuration of a Server>
A configuration of a server in which the semiconductor storage device disclosed in the present embodiment is incorporated is depicted in FIG. 4. FIG. 4 is a diagram of a configuration of the server. As illustrated in FIG. 4, the server includes, on a backplane 100, a plurality of cross-bus switches (XBs) 101, 102, and so on. The server also includes system boards (SB) 110 to 113 and an input/output system board (IOSB) 150 that are provided for each of the cross-bus switches. The quantities of the cross-bus switches, the system boards, and the input/output system boards are merely an example. The present application is not limited to this example.

The backplane 100 is a circuit board on which buses that mutually connect a plurality of connectors or the like are provided. Each of the XBs 101 and 102 is a switch that dynamically selects a path for the data exchanged between the system boards and the input/output system board.

Further, the SBs 110, 111, 112, and 113 connected to each of the XBs 101 and 102 are electronic circuit boards structuring an electronic device and have mutually the same configuration. Thus, only the SB 110 will be explained below. The SB 110 includes a system controller (SC), four CPUs, Memory Access Controllers (MACs), and Dual Inline Memory Modules (DIMMs).

An SC 110a exercises control over the entirety of the SB 110 by controlling data transfer processes and the like performed among CPUs 110b to 110e and MACs 110f and 110g mounted on the SB 110. Each of the CPUs 110b to 110e is a processor that is connected to another electronic device via the SC 110a and that includes the semiconductor storage device disclosed in the present embodiment as a primary cache memory or a secondary cache memory.

The MAC 110f is connected to between a DIMM 110h and the SC 110a and controls accesses to the DIMM 110h. The MAC 110g is connected to between a DIMM 110i and the SC and controls accesses to the DIMM 110i. The DIMM 110h is a memory module that is connected to another electronic device via the SC 110a and can have a memory attached thereto to expand the memory. The DIMM 110i is a memory module that is connected to another electronic device via the SC 110a and can have a memory attached thereto to expand the memory.

The IOSB 150 is connected to each of the SBs 110 to 113 via the XB 101 and can also be connected to input/output devices via a Small Computer System Interface (SCSI), a Fibre Channel (FC), an Ethernet (registered trademark), and the like. The IOSB 150 controls data transfer processes and the like performed between the input/output devices and the XB 101. The electronic devices such as the CPUs, the MACs, and the DIMMs mounted on the SB 110 are merely examples. The types of the electronic devices and the quantities of the electronic devices are not limited to those illustrated in the drawings.

The components of each unit illustrated in the drawings are only for conceptually illustrating the functions thereof and are not always physically configured as illustrated in the drawings. For example, the specific modes of distribution and integration of the devices are not limited to those depicted in the drawings. It is acceptable to functionally or physically distribute or integrate all or a part of the devices in any arbitrary units, depending on various loads and the status of use. Further, all or an arbitrary part of the processing functions performed by the devices may be realized by a CPU or a Micro Processing Unit (MPU) and a computer program that is analyzed and executed by the CPU or the MPU or may be realized as hardware using wired logic.

The semiconductor storage device according to an embodiment achieves an advantageous effect where it is possible to reduce the macro area size while maintaining the high-speed operation and the redundancy efficiency.

BRIEF DESCRIPTION OF DRAWINGS

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:
1. A semiconductor storage device comprising:
a first cell array including a plurality of memory cells that are connected to a first word line and each of which is connected to each member of a first pair of bit lines including a first bit line and a first inversion bit line;
a second cell array including a plurality of memory cells that are connected to a second word line and each of which is connected to each member of a second pair of bit lines including a second bit line and a second inversion bit line; and a redundant cell array including a plurality of memory cells that are connected to a third word line different from the first and the second word lines and each of which is connected to the first inversion bit line of the first pair of bit lines and to the second bit line of the second pair of bit lines.

2. The semiconductor storage device according to claim 1, further comprising:
a word driver that controls the first word line when data is to be written to or read from any of the memory cells included in the first cell array, that controls the second word line when data is to be written to or read from any of the memory cells included in the second cell array, and that controls the third word line when data is to be written to or read from any of the memory cells included in the redundant cell array.

3. The semiconductor storage device according to claim 1, wherein the first inversion bit line of the first pair of bit lines and the second bit line of the second pair of bit lines that are connected to each memory cell included in the redundant cell array are connected to a read circuit.

4. The semiconductor storage device according to claim 1, further comprising:
a writing unit that outputs the data to be written to the first inversion bit line of the first pair of bit lines and the second bit line of the second pair of bit lines that are connected to each memory cell included in the redundant cell array.

5. The semiconductor storage device according to claim 1, further comprising:
a pre-charging operation cancelling unit that, when data is to be written to or read from any of the memory cells included in the redundant cell array, cancels pre-charging operations of the memory cells included in the first cell array and the memory cells included in the second cell array.

6. The semiconductor storage device according to claim 1, wherein the redundant cell array is positioned between the first cell array and the second cell array.

7. The semiconductor storage device according to claim 1, further comprising:
a first read circuit that is connected to each member of the first pair of bit lines and reads data from any of memory cells at least one of the first cell array and the redundant cell array;
a first light amplifying circuit that is connected to each member of the first pair of bit lines and writes data to any of memory cells at least one of the first cell array and the redundant cell array;
a first pre-charging operation cancelling unit that is connected to each member of the first pair of bit lines and, when data is to be written to or read from any of the memory cells of the redundant cell array, cancels a pre-charging operation;
a second read circuit that is connected to each member of the second pair of bit lines and reads data from any of memory cells at least one of the second cell array and the redundant cell array;
a second light amplifying circuit that is connected to each member of the second pair of bit lines and writes data to any of memory cells at least one of the second cell array and the redundant cell array; and
a second pre-charging operation cancelling unit that is connected to each member of the second pair of bit lines and, when data is to be written to or read from any of the memory cells of the redundant cell array, cancels a pre-charging operation.

8. The semiconductor storage device according to claim 7 further comprising:
a word driver that controls the third word line when data is to be written to or read from any of the memory cells included in the redundant cell array; wherein,
when the first light amplifying circuit or the second light amplifying circuit writes 0 to any of the memory cells included in the redundant cell array, the word driver sets high voltage to the third word line, the first light amplifying circuit sets low voltage to the first bit line and the second light amplifying circuit set low voltage to the second bit line,
when the first light amplifying circuit or the second light amplifying circuit writes 1 to any of the memory cells included in the redundant cell array, the word driver sets high voltage to the third word line, the first light amplifying circuit sets low voltage to the first inversion bit line and the second light amplifying circuit sets low voltage to the second inversion bit line,
when the first read circuit or the second read circuit reads 0 from any of the memory cells included in the redundant cell array, the word driver sets high voltage to the third word line and the second read circuit sets low voltage to the second bit line, and
when the first read circuit or the second read circuit reads 1 from any of the memory cells included in the redundant cell array, the word driver sets high voltage to the third word line and the first read circuit sets low voltage to the first inversion bit line.

* * * * *